United States Patent [19]

Parsons

[11] Patent Number: 4,738,937

[45] Date of Patent: Apr. 19, 1988

[54] METHOD OF MAKING OHMIC CONTACT STRUCTURE

[75] Inventor: James D. Parsons, Newbury Park, Calif.

[73] Assignee: Hughes Aircraft Company, Los Angeles, Calif.

[21] Appl. No.: 789,983

[22] Filed: Oct. 22, 1985

[51] Int. Cl.$^4$ ............................................. H01L 21/28
[52] U.S. Cl. .................................. 437/180; 437/187; 437/245
[58] Field of Search ................. 29/589, 590; 148/185; 357/15, 65; 427/84

[56] References Cited

U.S. PATENT DOCUMENTS

| | | | |
|---|---|---|---|
| 3,030,704 | 4/1962 | Hall | 29/589 |
| 3,510,733 | 5/1970 | Addamiano | 29/589 |
| 4,186,410 | 1/1980 | Cho et al. | 29/589 |
| 4,344,980 | 8/1982 | Yoder | 357/65 |
| 4,394,673 | 7/1983 | Thompson et al. | 357/15 |
| 4,395,727 | 7/1983 | Lauterbach | 357/65 |
| 4,502,209 | 3/1985 | Eizenberg et al. | 29/589 |

OTHER PUBLICATIONS

"CRC Handbook of Chemistry and Physics", 64 Ed. by Weast CRC Press, pp. F-79, F-103.
"The Schottky-Barrier Height of the Contacts Between Some Rare Earth Metal (and Silicate) and P Type Silicon", by H. Noyde et al., Appl. Phys. Lett. 38(11), Jun. 1981, pp. 865-866.
"VLSI Fabrication Principles", by S. K. Ghandhi, John Wiley & Sons p. 281.
*Journal of Crystal Growth,* 45(1978) pp. 318-325, "Ionized-Cluster Beam Epitaxy", by T. Takagi et al, also, pp. 326-331.
Characteristic of Thin Film Formed by the Ionized—Cluster Beam Technique, by I. Yamada et al.
*The Technology and Physics of Molecular Beam Epitaxy,* edited by E. H. C. Parker 1985, Plenum Press, Chaper 12, pp. 387-412.
*Appl. Phys. Letter,* 33(7), Oct. 1, 1978, pp. 651-653, "Nonalloyed Ohmic Contacts to A-GaAs Molecular Beam Epitaxy", by P. A. Barnes et al.

*Primary Examiner*—Brian E. Hearn
*Assistant Examiner*—Tom Thomas
*Attorney, Agent, or Firm*—Terje Gudmestad; W. K. Denson-Low; A. W. Karambelas

[57] ABSTRACT

An ohmic contact structure and method of forming the same are described which yield a true non-rectifying Schottky junction between a metallic material and a semiconductor material. The two materials are selected so that they satisfy the theoretical requirements for an ideal Schottky junction, with the work function of the metallic material less than that of an n-type semiconductor material and greater than that of a p-type simiconductor material. One of the materials is deposited upon the other by means of an epitaxial process, with the two materials being selected such that the difference in their lattice parameters is less than about 10%, and preferably less than about 5%. This process reduces or entirely eliminates the previous requirement for doping the contact region, and also eliminates a heat cycle that has previously been necessary to fabricate a non-rectifying junction.

8 Claims, 3 Drawing Sheets

METHOD OF MAKING OHMIC CONTACT STRUCTURE

BACKGROUND OF THE INVENTION

1. Field of the Invention

This invention relates to the formation of contacts between metals and semiconductor materials, and, more particularly, to the achievement of ohmic contacts which are substantially rectification-free.

2. Description of the Related Art

Contacts between metallic and semiconductor materials occur in a very large number of integrated circuit and other semiconductor devices. Such junctions typically exhibit a rectifying effect, and in many cases, it would be desirable to eliminate this rectification. Theoretically, a metallic element or compound should make a non-rectifying (ohmic) contact with a semiconductor if the two materials form an ideal Schottky junction. This type of junction was first postulated by W. Schottky in an article published in *Physik Zeits*, 41, 570 (1940). A non-rectifying Schottky junction was the predicted result of forming (a) a junction between a metallic element or compound and an n-type or intrinsic semiconductor material when the work function of the metallic material was less than that of the semiconductor material, or (b) a junction between a metallic material and a p-type or intrinsic semiconductor material when the work function of the metallic material was higher than that of the semiconductor material.

Unfortunately in practice, true Schottky junctions have been difficult to achieve. There is no general agreement on the reason for this, but several possible explanations have been proposed. One was given by John Bardeen in an article entitled "Surface States and Rectification at a Metal Semi-Conductor Contact," *Physical Review*, Vol. 71, No. 10 (May 15, 1947). In this article, Bardeen attributes the failure to achieve a true Schottky junction to the presence of interface states at the junction, with the interface states controlling the energy band bending of the semiconductor material regardless of its Fermi level. He postulated that there is a maximum number of "dangling bonds" at the junction between the two materials that could not be exceeded if a true Schottky junction was to be attained. Another theory blames the failure to achieve a true Schottky junction on quantum effects at the interface between the metallic and semiconductor materials. The problem has also been attributed to a dipole layer of charge on the surface of the semiconductor material which, being a sensitive function of surface conditions, has no unique value for a given semiconductor material (L. P. Hunter, *Handbook of Semiconductor Electronics*, McGraw-Hill, Inc., 1970, pages 3-4).

In practice, it has been necessary to substantially complicate the circuit fabrication process to achieve generally non-rectifying metal-semiconductor junctions. For semiconductor materials, the accepted process first requires a heavy doping of the semiconductor to move its Fermi level closer to or entirely into its conduction band. A metal or metal alloy is then deposited on the doped semiconductor and heated until the desired ohmic contact is achieved. In addition to complicating the fabrication process, the temperature cycling can make the resulting device unusable for certain applications.

A somewhat more detailed analysis of an ideal Schottky junction will be helpful in providing a background for the invention. A good reference is McKelvey, *Solid State and Semiconductor Physics*, Harper & Row (1965). Semiconductor materials are characterized by a valence band and a higher energy electron conduction band, separated by an energy gap known as the "forbidden zone." Each electron found in the conduction band comes from the valence band and leaves a corresponding vacancy there. This fact is used to define the "Fermi level," which is the energy level at which the probability that the number of electrons which have been excited across the energy gap at a particular temperature will be equal to the number of electrons remaining in the conduction band. For example, if the energy level density functions of the conduction and valence band are identical in magnitude and symmetrical in form about the energy gap (a condition which does not precisely occur in practice), the Fermi level will be at the exact center of the energy gap. If the valence band contains twice the density of states or energy levels as the conduction band, the Fermi level will be somewhat above the center of the energy gap to maintain the number of electrons in the conduction band equal to the number of vacancies in the valence band. If, on the other hand, the conduction band contains a higher density of states than does the valence band, the situation will be reversed and the Fermi level will lie somewhat below the center of the energy gap. In all three cases the total number of electrons in the conduction band and the vacancies in the valence band will increase with increasing temperature.

When metallic and semiconductor materials having different work functions are brought into contact with one another, a brief transient current flow takes place which transfers electrons from the material with the larger Fermi level to the one with the smaller Fermi level, thereby generating an equilibrium contact potential difference between the two. This phenomenon is illustrated in FIGS. 1(a)-(c) for the case of a contact between a metal and an n-type semiconductor crystal, in which the metal's work function, $WF_M$, is larger than the work function $WF_{SC}$ associated with the semiconductor. Initially, as illustrated in FIG. 1(a), the two materials are separated by a distance d1 which is assumed to be relatively large, perhaps on the order of a centimeter. Under these circumstances, the Fermi levels of the two materials do not coincide, and the system is not in equilibrium. To achieve equilibrium, electrons would have to tunnel through the potential barrier from the semiconductor material with the higher Fermi level to the metal with the lower Fermi level until a condition of equilibrium in which the two Fermi levels coincide is attained.

As the two materials are brought closer together to a separation d2, as illustrated in FIG. 1(b), the thickness of the tunneling barrier becomes less and less, until finally the tunneling probability becomes sufficiently large that electrons penetrate the barrier, flowing from right to left in the figure. The physical separation d2 which is necessary to bring this about is a few times the interatomic distance. The flow of electrons from the semiconductor to the metal continues as the materials are brought into actual or near contact, at which point electrons tunnel freely through the barrier. An electric field arises largely within the semiconductor due to the contact potential difference. The potential energy of an electron at rest at the bottom of the conduction band in the interior of the crystal thus differs from the potential energy of such an electron at the surface by the difference in the work functions of the two materials and, as a result, the conduction and valence band edges are shifted with respect to the Fermi level as illustrated in FIG. 1(c). A positive space charge density is formed in the surface region due to the excess concentration of ionized donor atoms over the electron population, in conjunction with the electrons which tunneled through to the metal. This space charge density is just enough to produce an electric field sufficient to sustain the potential difference $WF_{M-SC}$ between the two materials.

In the described example, the net carrier density near the semiconductor surface is reduced from its bulk equilibrium value, and the surface layer is referred to as a depletion region. If $WF_{M-SC}$ is sufficiently large, the bands may be shifted with respect to the Fermi level to such an extent that the region next to the surface of the valence band is nearer the Fermi level than is the conduction band; the material immediately adjacent the surface then becomes, in effect, p-type. In this condition, the surface is then said to be inverted in conductivity type, and the surface p-type region is called an inversion region.

In the example of FIG. 1(c), a potential barrier having a height of $WF_{M-SC}$ is formed at the surface. The depletion region is quite thick, and there is little possibility (except under extreme circumstances) for electrons to be able to tunnel through the barrier. The contact thus forms an effective rectifier.

The formation of an ideal Schottky barrier is illustrated in FIGS. 2(a) and (b). In contrast to the rectifying junction of FIGS. 1(a)-(c), in FIGS. 2(a) and (b) the work function of the metallic material is assumed to be less than the semiconductor work function. As the materials are brought together, the semiconductor acquires a negative charge, the metallic material acquires a positive charge, and the bands shift downward at the surface rather than upward. As a result, instead of a potential barrier, an accumulation region is formed in which the electron concentration is greater than the concentration of ionized donor atoms. The excess electron concentration in the surface accumulation region gives rise to a negative space charge which supports the contact potential difference between the two materials. A non-rectifying junction in which electrons are free to flow in either direction without encountering a barrier is thus the theoretical result of the described Schottky junction.

While the above discussion has been limited to n-type semiconductors, similar effects result from p-type semiconductors. A depletion of inversion region, with an accompanying potential barrier, is formed at the interface between a p-type semiconductor and a metal whose work junction is smaller than that of the semiconductor, while an accumulation layer that gives rise to a non-rectifying jucention is formed between the p-type semiconductor and a metal having a larger work function.

Although the ideal Schottky junction has been extensively discussed in the literature, efforts to achieve such a junction in practice have been frustrated. As mentioned above, several different theories have been proposed to explain this failure, but none of the theories have proposed a viable way to implement a solution.

SUMMARY OF THE INVENTION

In view of the above problems associated with the prior art, it is an object of the present invention to provide a novel and improved ohmic contact structure and a method of making the same which satisfies the non-rectifying criteria of the ideal Schottky junction.

Another object is the provision of such an ohmic contact structure and method which uses known processing techniques and does not unduly complicate the fabrication of integrated circuits and other devices.

These and other objects are achieved by the use of an epitaxial process to fabricate a junction having opposed layers of metallic and semiconductor materials, the materials being selected to satisfy the ideal Schottky junction criteria (metallic work function greater than semiconductor work function for p-type semiconductor material, metallic work function less than semiconductor work function for n-type semiconductor material). While epitaxy is a well-known process for forming one layer of semiconductor material on another, it has been surprisingly discovered that the same process when applied to ideal Schottky junction materials whose lattice parameters differ by no more than about 10%, and preferably by no more than about 5%, will produce a true non-rectifying Schottky junction.

These and other features and objects of the invention will be understood by those skilled in the art from the accompanying detailed description of preferred embodiments, taken together with the accompanying drawings.

DESCRIPTION OF THE PREFERRED EMBODIMENTS

Figure 1:
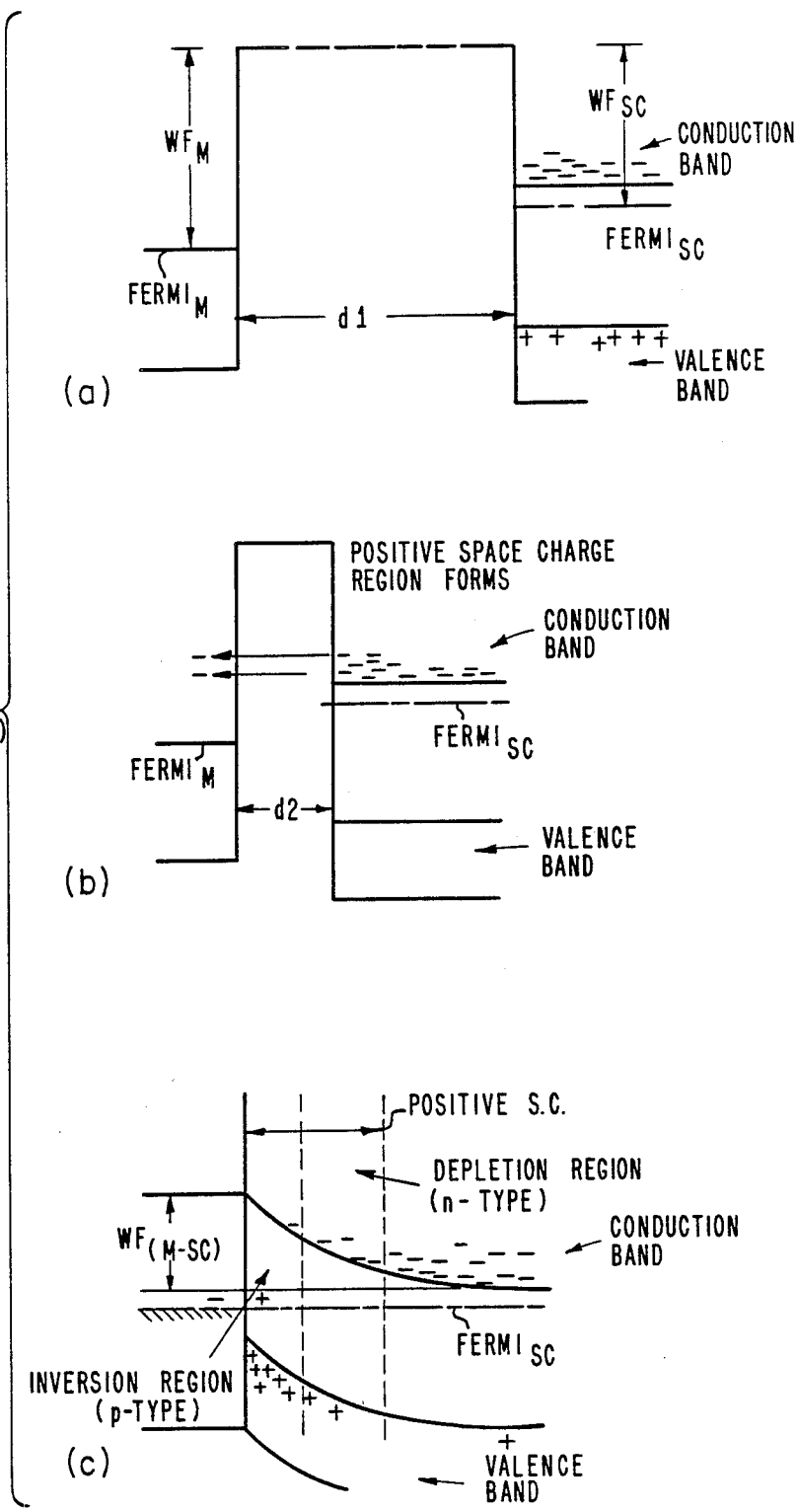
FIGS. 1(a)-(c) are diagrams illustrating the energy band situation for a metallic-semiconductor junction with work function characteristics opposite to a non-rectifying Schottky junction, discussed above.
Figure 2:
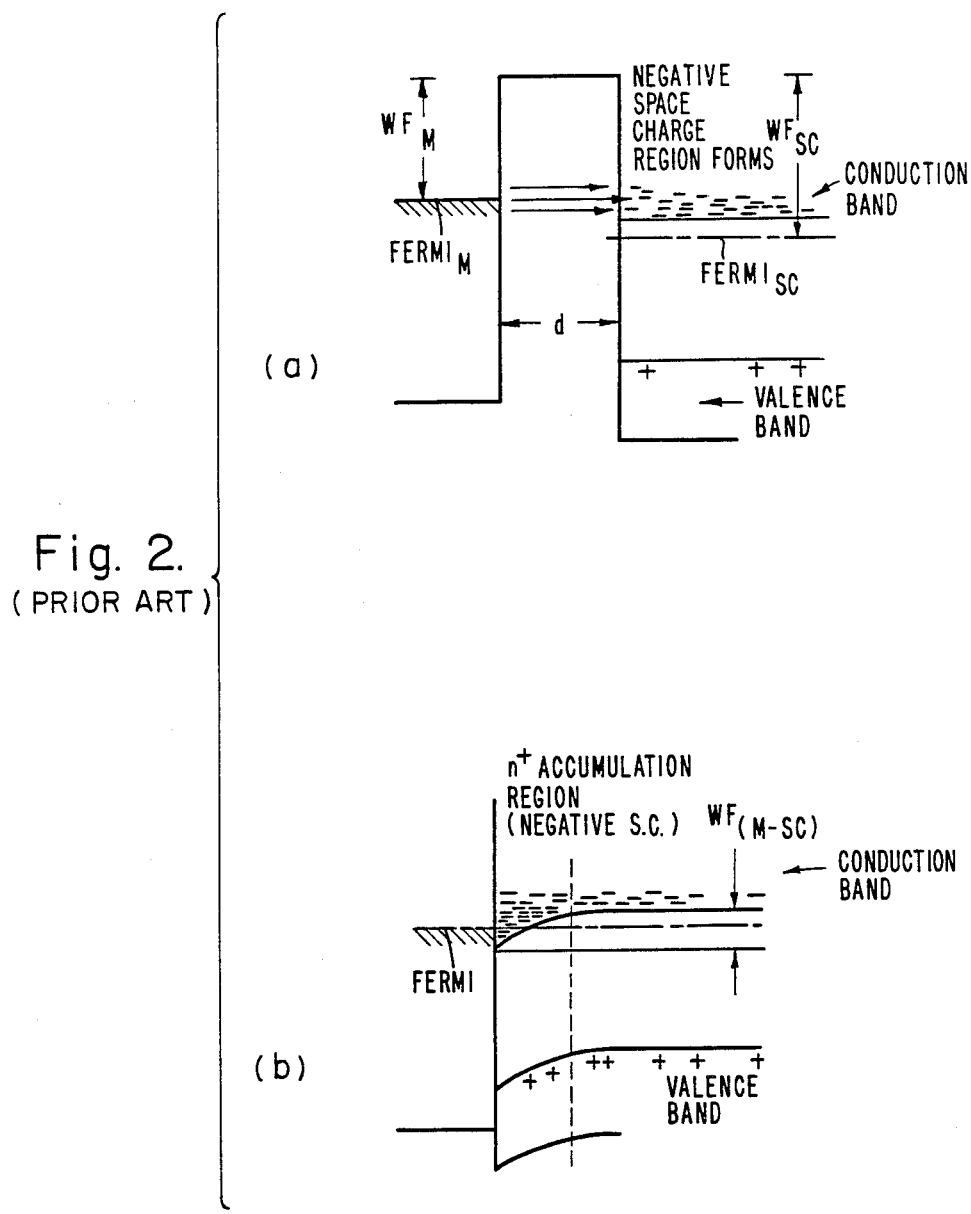
FIGS. 2(a)-(b) are diagrams illustrating the energy band situation for a metallic-semiconductor junction having the appropriate work functions to form a theoretically non-rectifying Schottky junction, discussed above.

The crux of the invention resides in the discovery that the use of an epitaxy process to form a contact between metallic and semiconductor materials whose work functions correspond to an ideal non-rectifying Schottky junction makes it possible to form a true ohmic contact. Epitaxial growth techniques have been in common use for a considerable period of time and are well developed for growing one type of semiconductor material onto another type of semiconductor material, as in the fabrication of transistors or semiconductor diodes. However, despite the lengthy period of time during which the ideal Schottky junction theory has been analyzed and attempts have been made to achieve such a junction, the use of an epitaxy process has been regarded as pertaining to a semiconductor-semiconductor deposition, and not to a metal-semiconductor contact. A unique feature of the invention is the recognition that the use of epitaxial processing, together with an appropriate selection of relative lattice parameters for the metallic and semiconductor materials, can yield the long sought goal of achieving ohmic contacts with undoped or lightly doped, wide band-gap materials.

The term "epitaxy" was coined to denote mutually oriented overgrowth, in a chemical sense, of dissimilar substances. Although the various semiconductor layers that are commonly built up by the use of epitaxy may be viewed as comprising similar materials, traces of impurities in otherwise similar semiconductors can change their physical properties considerably. In practice, epitaxial film growth is generally realized by passing a suitable gas, containing in a gaseous form the material which is to be deposited, over a substrate surface under temperature and pressure conditions which force the gaseous atoms to be released and to settle at proper sites on the substrate. In traditional semiconductor device fabrication, adequate doping is achieved by the injection of gaseous impurity compounds into the gas phase. The control of doping levels, thickness and crystal perfection are well-known parameters of the various epitaxial processes that are currently available. Additionally, epitaxial growth of doped and undoped semiconductor elements, compounds and alloys are commonly achieved from the liquid phase. This is known as liquid phase epitaxy (LPE).

The term "heteroepitaxy" is frequently used to designate an epitaxy process applied to two chemically dissimilar materials. For purposes of this application, however, the term "epitaxy" will be used in its broader sense to include both a heteroepitaxy and a process involving chemically similar but physically different materials. An epitaxy process is basically a process in which material is deposited onto a substrate in a manner to reproduce the substrate crystal structure. An epitaxial growth is one in which the deposited material has the same orientation as the substrate crystal. Most vapor phase epitaxial processes, typically utilize direct pyrolysis or chemical reactions within the gas phase to produce an element, compound or alloy semiconductor, which is subsequently deposited on heated single-crystal substrates. The term "vapor growth" has thus become associated with epitaxy. Vapor-phase epitaxial techniques are the most important at present for semiconductor device fabrication. To a lesser extent, technologies based upon evaporation (MBE or molecular beam epitaxy), LPE, VPE (vapor phase epitaxy) and MOCVD (metal organic chemical vapor deposition) have also been developed and applied. Any of these epitaxy processes can be used for the present invention, although at the present time vapor growth is preferred, depending on the device to be produced.

Figure 3:
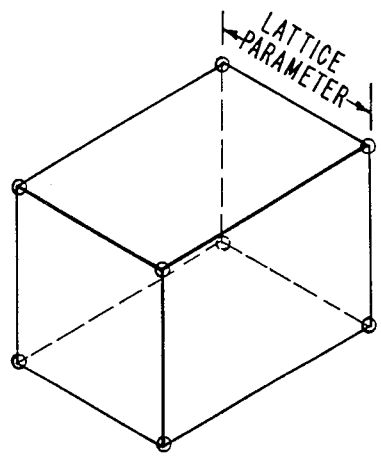
FIG. 3 is an illustration of a lattice crystal structure showing lattice parameter.

Although not yet extensively tested, the selection of relative lattice parameters for the metallic and semiconductor materials used to form an ohmic contact with the present invention is believed to be highly important. FIG. 3 illustrates a simple cubic lattice structure, with an atom at each corner of the cube. The "lattice parameter" is defined as the distance between adjacent atoms, defining the particular Bravais lattice.

In accordance with the invention, metallic and semiconductor materials to form an ohmic contact are selected to satisfy the requirements of an ideal non-rectifying Schottky junction. That is, the metallic element or compound has a lower work function than the semiconductor material for n-type material, and a higher work function than the semiconductor material for p-type material. Furthermore, although it has not yet been positively determined whether greater differentials in lattice parameter will prevent an ohmic contact, it is believed that the difference in lattice parameters between the metallic and semiconductor materials should not exceed about 10%, and preferably should be less than about 5%. The basis of this belief is that the restriction of lattice parameter differentials will reduce the number of "dangling bonds" at the interface between the metallic and semiconductor materials. This is consistent with the Bardeen article referred to previously, which proposes that the density of dangling bonds should be kept below a maximum level to achieve an ideal Schottky junction.

Figure 4:
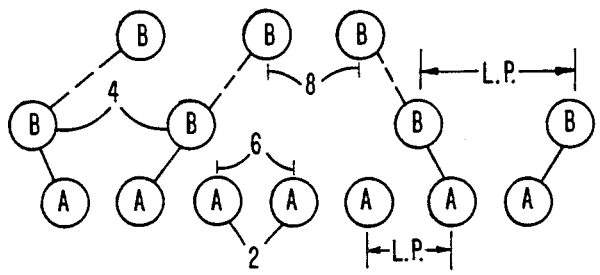
FIG. 4 is an illustration of a metal-semiconductor interface with a relatively large proportion of "dangling bonds"

FIG. 4 illustrates a metal-semiconductor junction characterized by a relatively large density of dangling bonds. At the interface, the semiconductor substrate atoms (2) are illustrated as being aligned in a single crystal lattice structure which can have a relatively small lattice parameter. These atoms, greatly simplified, form the surface of a semiconductor layer. A layer of randomly aligned deposited metallic material with metallic atoms (4) is shown establishing a non-rectifying junction with the semiconductor substrate layer. The metallic lattice structure is illustrated as having a considerably larger lattice parameter (though this is not the case in all instances). With this selection of materials, however, many bonding electrons will be unsaturated, due to the un-oriented, non-epitaxial polycrystalline growth of the metallic film. Most or all of the metallic atoms directly at the interface will bond with corresponding semiconductor atoms at the interface, but because of the smaller semiconductor lattice parameter, a large number of semiconductor atoms will be left with dangling bonds (6) which do not meet a corresponding metallic atom. Similarly, atomic bonds (8) in a secondary strata of the metallic lattice structure may also be left dangling for lack of either a corresponding semiconductor or metallic atom.

Figure 5:
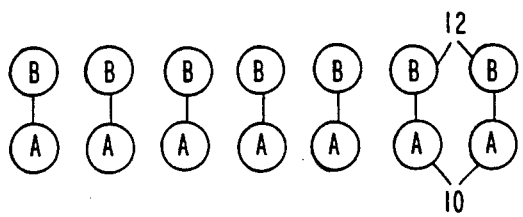
FIG. 5 is an illustration of the metal-semiconductor interface achieved by the present invention.

The number of dangling bonds may be greatly reduced by selecting metallic and semiconductor materials with similar lattice parameters. This situation is illustrated in FIG. 5, in which a semiconductor substrate layer with interface atoms (10) has a crystal structure theoretically identical to the crystal structure of a deposited metallic layer with metallic interface atoms (12). Each interface semiconductor atom forms a bond with a corresponding metallic interface atom, and vice versa. All of the bonds at the interface are thus occupied, leaving no dangling bonds.

While in practice, semiconductor and metallic materials with exactly matching lattice parameters are not available, it is believed that restricting the differential in lattice parameters to less than about 10%, and preferably to less than about 5%, will keep the number of dangling bonds down to a level at which essentially ohmic contact behavior can be achieved. Whereas an interface which is normally considered to be "clean" typically has about $10^{12}$–$10^{13}$ dangling bonds/cm$^2$, it is believed that this density of dangling bonds should be reduced by 1–3 orders of magnitude to produce an effective ohmic contact. The density of dangling bonds will generally vary exponentially with the lattice parameter differential for a two-dimensional interface.

It should be noted that in FIGS. 4 and 5, a metallic layer is illustrated as being deposited upon a semiconductor substrate. As applied to the present invention, however, conventional epitaxial processes can successfully be employed in either direction of deposition. That is, a metallic material can be deposited onto a semiconductor substrate, or a semiconductor material can be deposited onto a metallic substrate.

The described ohmic contacts have a vast array of applications, such as in transistors, diodes, solar cells, photodetectors, laser diodes and waveguide structures. One example of a particularly advantageous application is in "hot electron" transistors, which are bipolar transistors with very narrow band-gap base regions in which electrons are accelerated to very high velocities. Other particularly advantageous applications include silicon integrated circuits capable of surviving high temperature thermal processing, and reduced boron concentrations for p-type ohmic contacts in silicon. The use of ytterbium (Yb) as a contact metal on silicon (Si) offers an ohmic contact solution to these applications. A Yb/n-type Si combination should work particularly well because: (1) Yb has a substantially lower work function than Si; (2) both Yb and Si have a cubic crystal structure; (3) the lattice mismatch between Si and Yb is less than 1%; and (4) Yb is very dense (in single crystal epitaxial form) and could prevent aluminum diffusion into Si during high temperature IC processing.

A considerable number of metal semiconductor material combinations should be proposed that would satisfy the requirements of the invention, i.e., that their relative work functions are consistent with an ideal Schottky junction, that the junction be formed by an epitaxy process, and that the differential in lattice parameters not be excessive (the absolute limits of the lattice parameter differential have not yet been determined). There should preferably be a fairly large differential in the work functions of the two materials; if the work functions are too close, it may be necessary to dope the semiconductor material. While work function varies with a material's doping level, an exact correspondence between the two is difficult to predict.

In addition to Yb on undoped or lightly doped n-type Si, the following are examples of metallic-semiconductor combinations that could be grown epitaxially and would satisfy the work function and lattice parameter requirements of the present invention:

nickel disilicon (NiSi$_2$) and n-type Si,
beta tungsten ($\beta$W) and n-type Si,
rubidium (Rb) and n-type gallium arsenide (GaAs),
zirconium tin (SnZr$_3$) and n-type gallium arsenide (GaAs),
titanium carbide (TiC) and n-type beta-silicon carbide ($\beta$SiC),
Sodium (Na) and p-type gallium phosphide (GaP).

The approximate work functions and the lattice parameters of these various combinations are as follows:

|  | Work Function (eV) | Lattice Parameter (Å) at Room Temp. |
| --- | --- | --- |
| Yb | 2.6 | 5.481 |
| n-type Si | 4.8 | 5.43086 |
| NiSi$_2$ | 4.55 | 5.395 |
| n-type Si | 4.8 | 5.43086 |
| $\beta$W | 4.6 | 5.048 |
| n-type Si | 4.8 | 5.43086 |

|  | Work Function (eV) | Lattice Parameter (Å) at Room Temp. |
| --- | --- | --- |
| Rb | 2.2 | 5.63 |
| n-type GaAs | 4.7 | 5.6534 |
| Zr$_3$Sn | 4.1 | 5.634 |
| n-type GaAs | 4.7 | 5.6534 |
| TiC | 2.7 | 4.3276 |
| n-type $\beta$SiC | 4.6 | 4.358 |
| Na | 2.3 | 5.35 |
| p-type GaP | 1.3 | 5.4495 |

The epitaxial approach of the present invention considerably simplifies the achievement of a true ohmic contact. It reduces or, where the work functions of the metallic and semiconductor materials are sufficiently separated, completely eliminates the previous requirement of doping the region where an ohmic contact is desired, and also eliminates the heat cycle that has been necessary until now. Only standard types of masking and etching steps, which are necessary anyway in the formation of integrated circuits, are required.

Several embodiments of ohmic contacts constructed in accordance with the invention have been illustrated and described. As numerous modifications and alternate embodiments will occur to those skilled in the art, it is intended that the invention be limited only in terms of the appended claims.

What is claimed is:

1. A method of forming an ohmic contact structure, comprising:

selecting a semiconductor material wherein the doping level is less than degenerate which has a first work function and is characterized as an n or p-type material;

selecting a metallic material having a second work function which is greater than the first work function for a p-type semiconductor, and less than the first work function for an n-type semiconductor and wherein the respective lattice parameters of the semiconductor material and metallic material differ from each other by no more than 10%; and growing one of the materials directly upon the other material by an epitaxial process to form an ohmic contact between the two materials.

2. The method of claim 1, wherein the respective lattice parameters of the two materials differ from each other by no more than 5%.

3. The method of claim 2, wherein the semiconductor and metallic materials respectively comprise n-type silicon and ytterbium.

4. The method of claim 2, wherein the semiconductor and metallic materials respectively comprise n-type beta-silicon carbide and titanium carbide.

5. The method of claim 1, wherein the semiconductor material is undoped or lightly doped.

6. The method of claim 5, wherein the respective lattice parameters of the two materials differ from each other by no more than about 5%.

7. The method of claim 6, wherein the semiconductor and metallic materials respectively comprise n-type silicon and ytterbium.

8. The method of claim 6, wherein the semiconductor and metallic materials respectively comprise n-type beta-silicon carbide and titanium carbide.

* * * * *